United States Patent
Pan et al.

(10) Patent No.: US 9,176,541 B2
(45) Date of Patent: Nov. 3, 2015

(54) ELECTRONIC DEVICE

(71) Applicants: Zhengmin Benjamin Pan, Shenzhen (CN); Bingke Zhu, Shenzhen (CN); Linzhen Li, Shenzhen (CN); Xingzhi Huang, Shenzhen (CN)

(72) Inventors: Zhengmin Benjamin Pan, Shenzhen (CN); Bingke Zhu, Shenzhen (CN); Linzhen Li, Shenzhen (CN); Xingzhi Huang, Shenzhen (CN)

(73) Assignee: AAC Technologies Pte, Ltd., Singapore (SG)

( * ) Notice: Subject to any disclaimer, the term of this patent is extended or adjusted under 35 U.S.C. 154(b) by 30 days.

(21) Appl. No.: 14/070,617

(22) Filed: Nov. 4, 2013

(65) Prior Publication Data

US 2014/0126128 A1 May 8, 2014

(30) Foreign Application Priority Data

Nov. 5, 2012 (CN) .......................... 2012 2 0575575

(51) Int. Cl.
| | |
|---|---|
| *G06F 1/16* | (2006.01) |
| *H05K 5/03* | (2006.01) |
| *H05K 7/14* | (2006.01) |
| *H04M 1/00* | (2006.01) |

(52) U.S. Cl.
CPC ............ *G06F 1/1688* (2013.01); *G06F 1/1656* (2013.01); *H04M 1/00* (2013.01); *H05K 7/14* (2013.01)

(58) Field of Classification Search
CPC ....... G06F 1/1605; G06F 1/163; G06F 3/011; G06F 3/014; G06F 1/1613; G06F 1/1626; G06F 1/1656; G06F 1/1601; G06F 1/1637; G06F 1/1688; H05K 2201/09072; H05K 2201/10083; H05K 1/0284; H05K 1/182; H05K 2201/09036; H05K 3/4697; H05K 5/0017; H05K 5/061; H05K 5/0013; H05K 5/0221; H05K 5/0004; H05K 5/0247; H05K 5/03; H05K 7/14; H04M 1/026; H04M 1/00
USPC ............ 361/679.01, 679.02, 679.09, 679.08, 361/679.21, 679.26, 679.27, 679.3, 361/679.55–679.58; 455/575.1–575.4; 379/433.11–433.13
See application file for complete search history.

(56) References Cited

U.S. PATENT DOCUMENTS

| | | | | |
|---|---|---|---|---|
| 8,301,213 | B2 * | 10/2012 | Murata et al. | ............... 455/575.8 |
| 8,879,771 | B2 * | 11/2014 | Mellow et al. | ................. 381/388 |
| 2009/0247244 | A1 * | 10/2009 | Mittleman et al. | ......... 455/575.1 |
| 2010/0027814 | A1 * | 2/2010 | Chen et al. | ..................... 381/150 |

FOREIGN PATENT DOCUMENTS

KR    1020050077166    *    1/2005

* cited by examiner

*Primary Examiner* — Anthony Haughton
*Assistant Examiner* — Ingrid Wright
(74) *Attorney, Agent, or Firm* — IPro, Inc.; Na Xu

(57) ABSTRACT

Disclosed is an electronic device. The electronic device includes a shell, a display panel coupled with the shell for forming an accommodating space, a receiver positioned in the accommodating space and a sound hole formed on the display panel. The sound hole is composed of a number of tiny holes, each of the tiny holes has a diameter less than 0.1 millimeter. The electronic device has a high working reliabilities and a good communication sound effect.

7 Claims, 2 Drawing Sheets

ELECTRONIC DEVICE

FIELD OF THE INVENTION

The disclosure described herein relates generally to electronic devices, and more particularly, to an electronic device including a sound generator for transmitting sounds.

DESCRIPTION OF RELATED ART

With the development of communication technologies, an electronic device having communication function becomes a necessity of people's everyday life. People are not only content with communication function any more, but also request that the electronic device has nice appearance and perfect performance.

A related electronic device typically includes a shell, a display screen on the shell, a receiver accommodated in the shell and behind an upper end of the display screen, and a sound hole in the shell or the screen for leaking the sound out.

However, the related electronic device only has a single sound hole with great diameter. With the use of the electronic device, the dust or other particles will enter inside of the electronic device via the sound hole, which impacts the performance of components in the electronic device, even damages the components in the electronic device. Furthermore, the sound hole will be also easily blocked up by the dust or other particles, which would affect the sound performance during communication. Besides, the sound hole of the related electronic device is a single hole having great diameter, it makes the appearance of the electronic device so boring and unattractive.

Therefore, an improved electronic device is provided in the present disclosure to solve the problems mentioned above.

Figure 1:
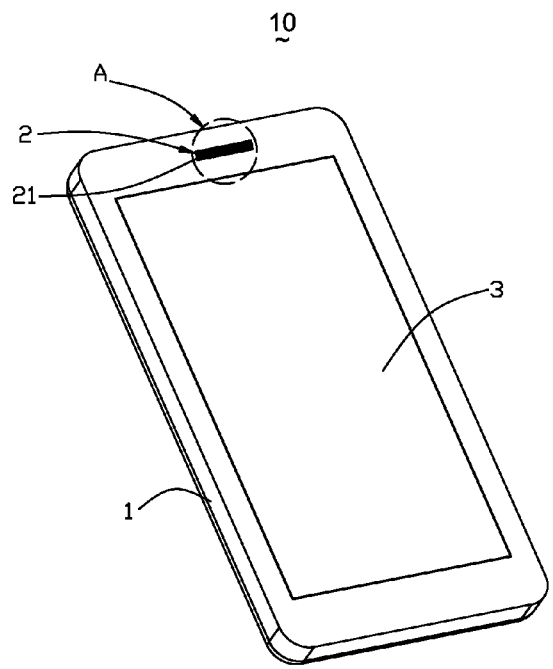
FIG. 1 is an isometric assembled view of an electronic device in accordance with an exemplary embodiment of the present invention.

Many aspects of the embodiment can be better understood with reference to the drawings mentioned above. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENT

Reference will now be made to describe the exemplary embodiment of the present invention in detail.

Figure 2:
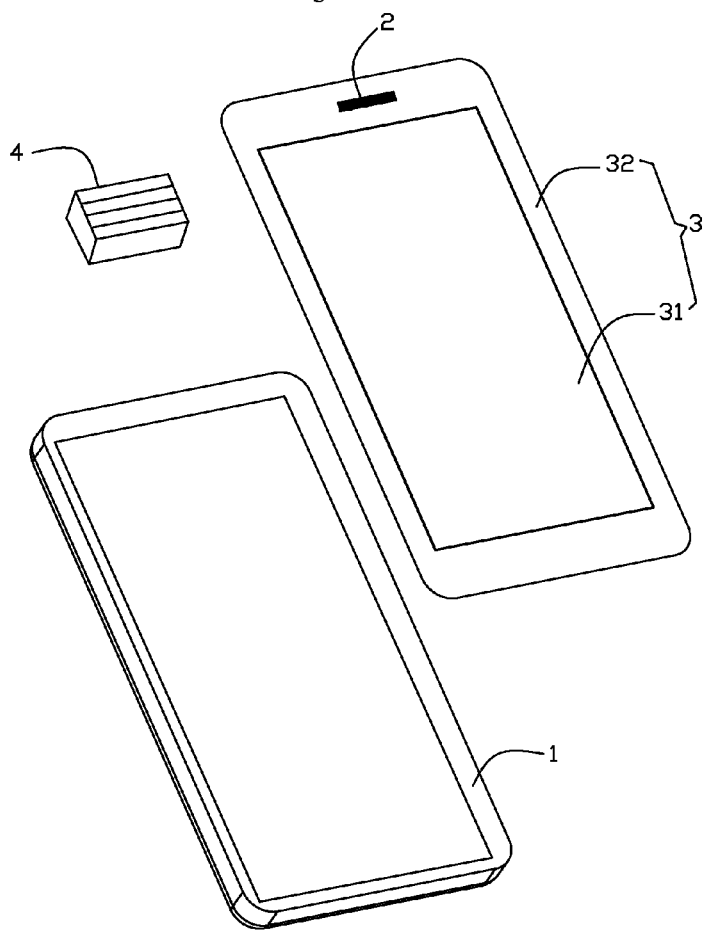
FIG. 2 is an exploded view of the electronic device in FIG. 1
Figure 3:
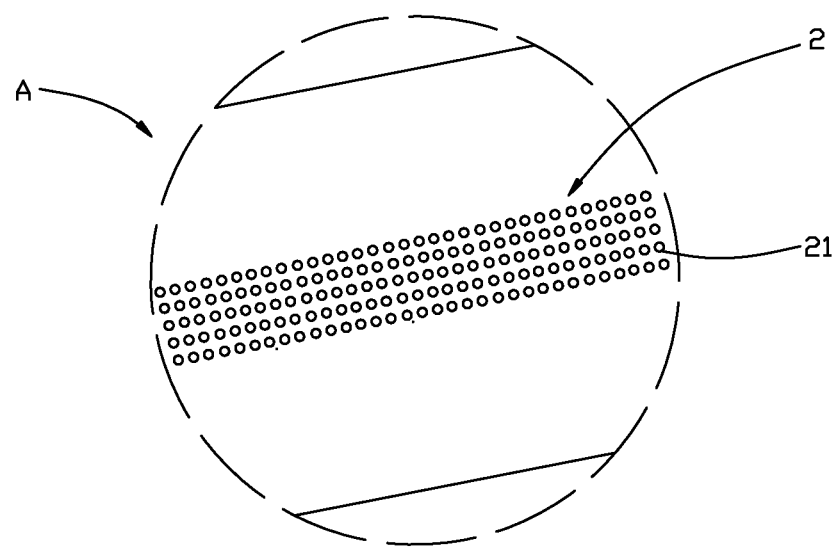
FIG. 3 is an enlarged view of the part indicated by A in FIG. 1.

Referring to FIGS. 1-3, an exemplary electronic device of this invention comprises a shell 1, a display panel 3 coupled with the shell 1 for forming an accommodating space and a receiver 4 positioned in the accommodating space. The display panel 3 further includes a screen 31 and a frame 32 surrounding and positioning on the screen 31. While assembled, the display panel 3 is mounted with the shell 1 with the frame 32 thereof fixed to an edge of the shell 1, and the receiver 4 is arranged behind the frame 32 or the screen 31.

The frame 32 of the display panel 3 forms a sound hole 2 which is acoustically communicated with the receiver 4. When the receiver 4 is activated by acoustic signals from an external circuit to generating sounds, the sound waves are transmitted outside of the electronic device via the sound hole 2. In order to prevent the dust or other particles entering inside of the electronic device and affecting the performances of the electronic device, the sound hole 2 is configured to include a plurality of tiny holes 21, each one of which has a diameter less than 0.1 millimeter. It is optional that all the tiny holes 21 are arranged in a matrix, and a distance between two adjacent tiny holes is configured less than 0.05 millimeter. The configuration of the sound hole ensures that the receiver communicates with the sound hole as the dust or other particle is blocked off by the tiny holes, and makes the area of the sound hole like a fog area, which makes the appearance of the display panel more beautiful.

It should be understood that the tiny holes 21 could be arranged in order or disorder. In this embodiment, the tiny holes 21 are arranged in order. More specifically, the tiny holes 21 are arranged in a matrix array.

The tiny holes 21 can also be arranged in a wavy pattern, a pyramid pattern or even a spiral pattern for a nice appearance.

Compared with the related art, the sound hole of the electronic device in this disclosure is composed of a plurality of tiny holes, and the configuration of the diameter of each tiny hole can prevent most of the dust and other particles entering inside of the electronic device and reduces the bad influences on the components in the electronic device, especially the bad influences on the receiver. It also ensures the high quality of the sound and the working reliabilities of the electronic device. The arrangement of the tiny holes also makes the electronic device have a nice appearance.

While the present disclosure has been described with reference to the specific embodiment, the description of the disclosure is illustrative and is not to be construed as limiting the disclosure. Various of modifications to the present disclosure can be made to the exemplary embodiment by those skilled in the art without departing from the true spirit and scope of the disclosure as defined by the appended claims.

What is claimed is:

1. An electronic device, comprising:
    a shell;
    a display panel coupled with the shell for forming an accommodating space;
    a receiver positioned in the accommodating space;
    wherein the shell includes a sound hole formed by a plurality of tiny holes, a distance between two adjacent tiny holes is not greater than 0.05 millimeter.

2. The electronic device as described in claim 1, wherein the tiny holes are arranged in a matrix.

3. The electronic device as described in claim 1, wherein the tiny holes are arranged in a wavy pattern.

4. The electronic device as described in claim 1, wherein, the tiny holes are arranged in a spiral pattern.

5. The electronic device as described in claim 1, wherein the tiny holes are arranged in a pyramid pattern.

6. The electronic device as described in claim 1, wherein the diameter of each tiny hole is 0.05 millimeter.

7. The electronic device as described in claim 1, wherein, each of the tiny holes has a diameter less than 0.1 millimeter.

* * * * *